(12) United States Patent
Sack

(10) Patent No.: US 7,170,198 B2
(45) Date of Patent: Jan. 30, 2007

(54) TRIGGER ARRANGEMENT FOR A MARX GENERATOR

(75) Inventor: Martin Sack, Rheinstetten (DE)

(73) Assignee: Forschungszentrum Karlsruhe GmbH, Karlsruhe (DE)

( * ) Notice: Subject to any disclaimer, the term of this patent is extended or adjusted under 35 U.S.C. 154(b) by 0 days.

(21) Appl. No.: 11/264,912

(22) Filed: Nov. 2, 2005

(65) Prior Publication Data

US 2006/0061932 A1    Mar. 23, 2006

Related U.S. Application Data

(63) Continuation-in-part of application No. PCT/EP2004/004101, filed on Apr. 17, 2004.

(30) Foreign Application Priority Data

May 8, 2003   (DE) ................... 103 20 425

(51) Int. Cl.
   *H03K 3/00*   (2006.01)
(52) U.S. Cl. .................. 307/106; 307/108; 307/110; 361/253; 361/257; 315/254; 315/246
(58) Field of Classification Search ........... 307/106, 307/108–110; 361/247, 253, 257, 268; 315/209 M, 315/246, 254, 258
See application file for complete search history.

(56) References Cited

U.S. PATENT DOCUMENTS

| | | | |
|---|---|---|---|
| 3,229,124 A | 1/1966 | Schonfield | 307/110 |
| 3,260,865 A | 7/1966 | Jelenik-Fink et al. | 307/109 |
| 3,721,886 A * | 3/1973 | Phinney et al. | 361/251 |
| 3,746,881 A | 7/1973 | Fitch et al. | 307/110 |
| 3,845,322 A | 10/1974 | Aslin | 307/108 |
| 4,189,650 A * | 2/1980 | Aaland | 307/108 |
| 4,375,594 A | 3/1983 | Ewanizky, Jr. | 307/110 |
| 5,153,460 A | 10/1992 | Bovino et al. | 307/108 |

\* cited by examiner

*Primary Examiner*—Haissa Philogene
(74) *Attorney, Agent, or Firm*—Klaus J. Bach

(57) ABSTRACT

In trigger/firing arrangement in a Marx generator comprising n stage capacitors—n being a natural number greater than 1-, the same amount of spark gaps and 2(n−1) charging branches, with the spark gaps operating in a self-breakdown mode, the trigger-/firing arrangement comprises at least a pulse transformer connected to an pulse generator in at least one of the charging branches of the Marx-generator, which with the associated stage capacitor bridges a spark gap—except for the output end spark gap—a pulse transformer is disposed, whose output winding operates during charging as a charging winding and whose input winding is connected to the pulse generator in such a way that the voltage pulse generated with this pulse transformer during triggering of the pulse generator is added to the charge voltage of the associated stage capacitor and, with a corresponding polarity, generates an over-voltage sufficient for initiating self-breakdown at this spark gap.

13 Claims, 2 Drawing Sheets

TRIGGER ARRANGEMENT FOR A MARX GENERATOR

This is a continuation-in-part application of international application PCT/EP2004/004101 filed Apr. 17, 2004 and claiming the priority of German application 103 20 435.3 filed May 8, 2003.

BACKGROUND OF THE INVENTION

The invention relates to a trigger/firing arrangement of a Marx generator including n stage capacitors n being a natural-number greater than 1—the same amount of switches/spark gaps and 2(n–1) charging branches with the spark gaps operating in a self-breakdown mode.

With a uni-polar output voltage, the Marx generator has generally as many spark gaps as it has stage capacitors. In its most simple construction, the spark gaps operate in self-breakdown mode. To each spark gap, except for the output spark gap, two charging branches are connected, one to each of the two connectors of the spark gap. As a result, there are altogether 2(n–1) charging branches associated with an n-stage Marx generator. With a charging voltage U at each of the stage capacitors at the output of the Marx generator, a voltage pulse with a peak value of n*U is obtained at breakdown.

Marx generators which can be triggered in a controlled manner either have three-electrode spark gaps or spark gaps with a trigger pin similar to a spark plug, known also as Trigatron Principle. Such Marx generators are generally operated in single pulse mode. To trigger repetitively operated Marx generators spark gaps are attempted to be operated in accordance with the principles mentioned with regard to minimum wear (see [1]) or to make the triggering operationally secure by optimized trigger generators (see [2]).

Furthermore, laser triggering methods or the use of semiconductor switches instead of spark gaps are being examined (see[4]). Another trigger method resides in the voltage inversion principle of the LC-Marx generator. In [5], a variant of this principle is described wherein transformers are used for the coupling between the steps. In addition, there are publications concerning the optimizing of the self-breakdown of spark gaps for the non-triggered operation (see [6]).

In spark gaps which can be triggered the trigger electrodes are subjected to high stress because of their exposed locations. Furthermore, the mechanical setup of a spark gap that can be triggered is more complicated than a spark gap without a trigger electrode.

It is the object of the present invention to trigger Marx generators with little wear by an over-voltage breakdown of one or more spark gaps at predetermined points in time particularly with regard to repetitive operations.

SUMMARY OF THE INVENTION

In trigger/firing arrangement in a Marx generator comprising n stage capacitors—n being a natural number greater than 1-, the same amount of spark gaps and 2(n–1) charging branches, with the spark gaps operating in a self-breakdown mode, the trigger-/firing arrangement comprises at least a pulse transformer connected to an pulse generator in at least one of the charging branches of the Marx-generator, which with the associated stage capacitor bridges a spark gap—except for the output end spark gap—a pulse transformer is disposed, whose output winding operates during charging as a charging winding and whose input winding is connected to the pulse generator in such a way that the voltage pulse generated with this pulse transformer during triggering of the pulse generator is added to the charge voltage of the associated stage capacitor and, with a corresponding polarity, generates an over-voltage sufficient for initiating self-breakdown at this spark gap.

The trigger/firing arrangement comprises basically a pulse transformer connected to a pulse generator. Such a pulse transformer is switched into at least one of the charging branches of the Marx generator which, together with the associated stage capacitor bridges a spark gap—except for the spark gap at the output side of the Marx generator. The output winding or secondary winding or the over-voltage side winding of the transformer acts during charging at least partly as a charging coil/inductivity. The input winding or primary winding of the pulse transformer is connected to the output of the pulse generator. Upon ignition/triggering of the pulse generator, in the output winding of the pulse transformer a voltage pulse is induced which is added to the charge voltage of the associated stage capacitor and, with the appropriate polarity resulting in an over voltage sufficient to initiate the breakdown.

Possible embodiments for triggering the spark gap/s are described, which, on one hand, cause reliable triggering of the Marx generator and, on the other hand, permit an efficient setup.

The Marx generator can be constructed in two ways depending on its intended use for repetitive operation or single shot operation. For repetitive operation, it has been found suitable to place a charging winding into the charging branches and complete at least one of these charging coils to the pulse transformer. In order to keep the electrical insulation expenses as low as possible or within limits at least at the ground-side charge branch such a charging coil which has been changed or expanded to an pulse transformer is placed.

If the Marx generator is charged by way of a charge resistor, at least into one charging branch an pulse transformer is switched. Its output winding is then arranged selectively directly in series with, or parallel to, the charge resistor.

In a Marx generator all spark gaps except for the output spark gap are bridged twice by a charging branch and an associated stage capacitor. At both connections of a spark gap always one charging branch is connected. The trigger/firing arrangement is such that an pulse transformer is installed in each of the two charging branches. Basically, this may be at each of the (n–1) spark gaps, again preferably at the spark gap with the lowest potential in order to limit the insulation expenses.

Preferably, the input windings of the two pulse transformers are connected electrically in series and are connected to a common pulse generator.

In a more complicated arrangement, each input winding is connected to its own pulse generator.

The pulse generator or generators can be differently controlled, either electrically or via an optical signal transmission. In the latter case, at least the pulse transformers all have the same isolation arrangement. If each pulse transformer has its own pulse generator then the construction components pulse transformer—pulse generator, are as far as isolation is concerned, equal at each stage.

The pulse generator and the input winding or windings connected thereto may be different in design. They may be in the form of a current source which can be rapidly switched off or it may be a voltage source. In the first case, the switch may be a switched transistor or switched transistors as they are used, for example, in the transistorized ignition system of a spark ignition engine. In the latter case, a choke coil (with core or core-less) is arranged in the charging branch in series with the output winding at the pulse transformer for limiting the current.

As voltage source, for example a capacitor with a switch or, for large power output, a Marx generator which is small in comparison to the Marx generator to be operated may be used.

To increase the reliability, the winding direction of the input winding for the pulse transformer is such that the voltage induced in the input winding as a result of the increase of the discharge current of the Marx generator is oriented opposite to the voltage induced by the output winding in accordance with the principle of the transformer.

The advantages of the arrangement described in comparison with a conventional trigger method reside on one hand, in a simple inexpensive design and, on the other hand, in a substantially lower wear than in conventional three-electrode spark gaps. As a result, a Marx generator for an industrial application may be built which has a long-term constant operating behavior. For a reliable operation in industrial applications this is absolutely necessary.

The trigger arrangement for a multi-stage Marx generator with at least one self-triggered spark gap will be described in greater detail below on the basis of the accompanying drawings.

DESCRIPTION OF PREFERRED EMBODIMENTS

In the arrangement described below the breakdown of the first spark gap FS1 of the exemplary three-stage Marx-generator shown is obtained by the short application of an over-voltage. The Marx generator shown herein is designed for the repetitive operation and is therefore equipped with the charging coils L1 to L4, which switch the capacitors C1 to C3 in parallel for the charging process (see FIGS. 1 to 3). In this connection, for example, the grounded charging winding L1 also comprises the pulse transformer. The voltage generated by this transformer is added to the charge voltage of the capacitor of the first stage, and, with a suitable polarity, generates the excess voltage at the spark gap FS1 of this stage. The over-voltage consequently causes in a time-controlled manner the self-breakdown of the spark gap FS1.

As primary or input winding of the pulse transformer L1, a winding comprising only a few turns is used. With a primary pulse voltage of a suitable level which in this case is for example 6 kV, the Marx generator is triggered reproducibly below the static trigger voltage.

With the voltage being supplied via the charging coil L1, the charging coil L2 is switched in parallel to the spark gap FS1 via the capacitor C2. The inductive voltage divider formed thereby comprising the charge winding L2 and the stray inductivity of the pulse transformer L1 with a negligibly large capacity of the stage capacitor C2 reduces the voltage across the spark gap with respect to idle operation. Accordingly, a higher primary voltage must be supplied than during idling and the charging coil L2 should have an inductivity as large as possible. On the other hand, with a small source impedance of the trigger pulse generator, the stray inductivity of L1 cannot be arbitrarily reduced, because otherwise, after firing of the Marx generator, an increased current would flow through L1 and the trigger pulse generator connected thereto.

Figure 2:
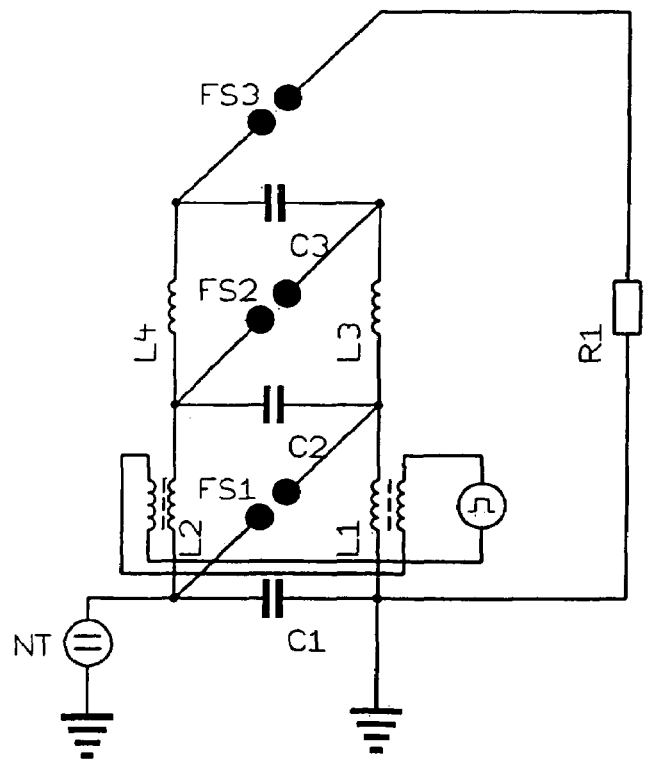
FIG. 2 shows over-voltage triggering with transformers in both charging branches.

In order to need the lowest possible power for the triggering, it is expedient if the charging coil L2 is expanded to form also an pulse transformer (see FIG. 2). To this end, the trigger pulse is supplied at the same time to both branches via a suitable primary side series or parallel circuit (claim 4 or 5) and with the same polarity in both branches. Since there is no current in either of the two branches up to the breakdown of the spark gap FS1—except for the small charging current of the stray capacities—the voltage across the spark gap FS1 is not reduced like in the first case by the inductive voltage drop at the stray inductivity of the pulse transformer L1. A disadvantage of this circuit variant however resides in the higher insulation expenditures for the pulse transformer L2, which must be additionally insulated for the stage voltage.

Figure 3:
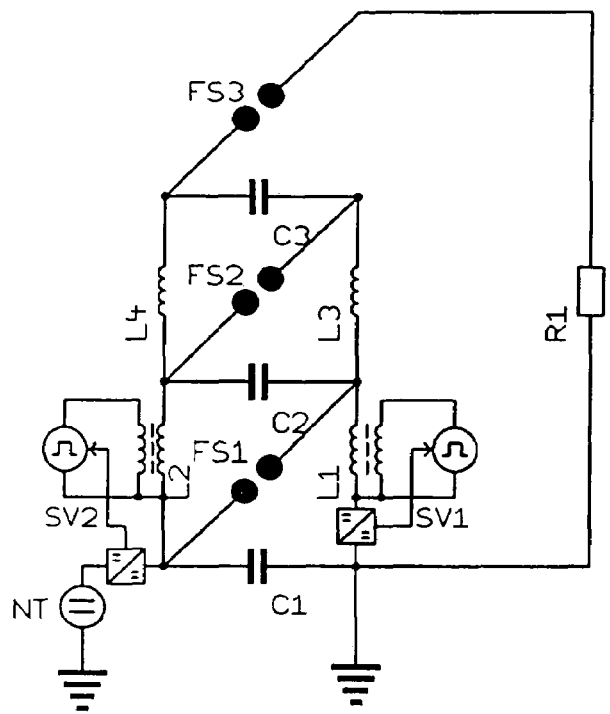
FIG. 3 shows the power supply of the trigger circuit from the charge current.

The increased insulation expenditure can be avoided if the charging current of the Marx generator is utilized for the energization of the trigger unit. To this end, during the charging, the energy for at least the next trigger pulse is stored in a suitable energy storage device, preferably a capacitor. FIG. 3 shows such an arrangement. The voltage supply may be selectively switched in series with the associated charging winding L1 or into the adjacent branch as shown for SV2. In contrast to a voltage supply from a battery, which cannot be recharged during operation, in this way, an operation can be established without the need for servicing. The triggering occurs for insulation-technical reasons expediently by means of a light signal via a connecting optical fiber conductor. The trigger unit consisting of the voltage supply, the pulse generator and the transformer can then simply be integrated into any stage of the Marx generator. Also, several triggers may be installed in a simple manner in order to bring the triggering behavior of the generator into a narrower time window, particularly with a relatively large number of stages.

Figure 1:
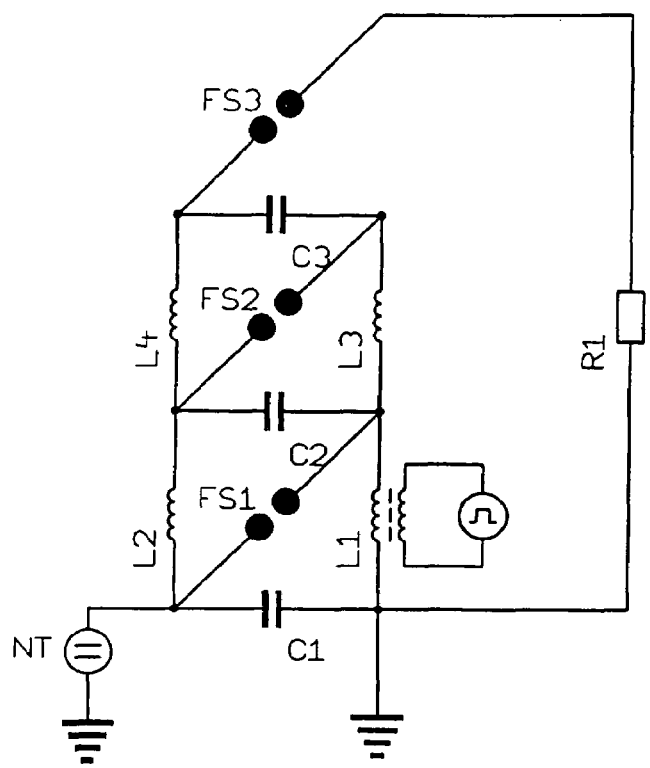
FIG. 1 shows a Marx generator with over-voltage triggering of the first spark gap.
Figure 4:
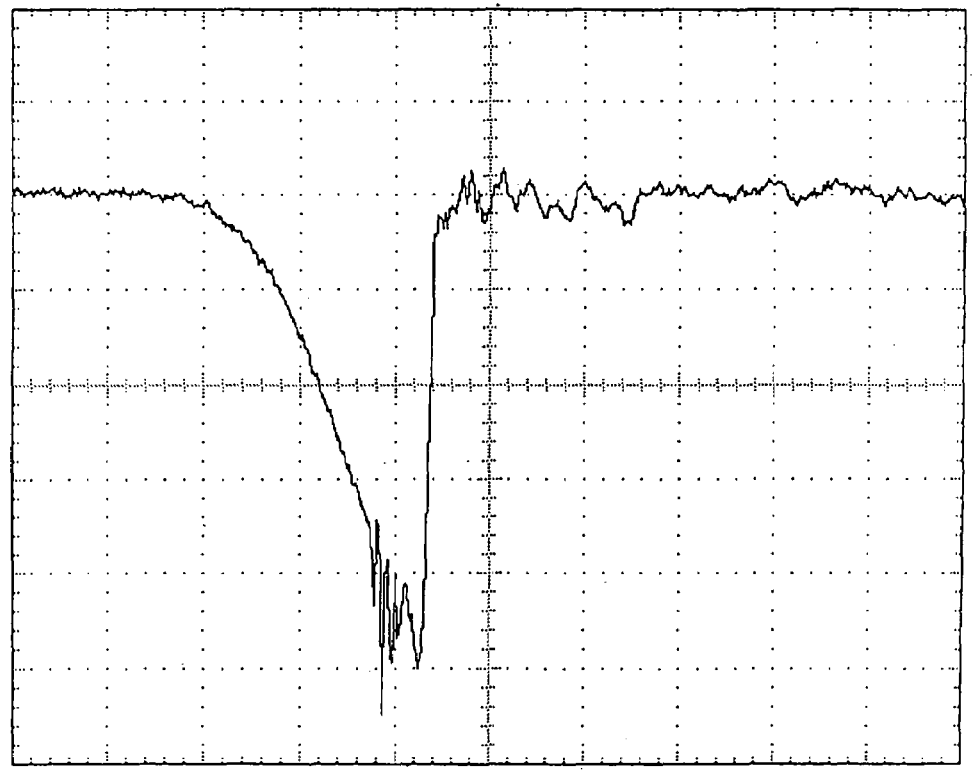
FIG. 4 an exemplary plot of the induced over-voltage (100 ns/Div. 2.5 kV/Div.).

The three-stage Marx generator as schematically shown in FIGS. 1 to 3 in an exemplary embodiment with a nominal stage voltage of 50 kV is designed for a total voltage of 150 kV. The bottom point of the Marx generator at C1 is grounded. The load is considered to be represented by the ohmic load resistor R1. The design-based inductivity of the main current path, which generally cannot be neglected and which is formed by the series circuit of the Marx generator and load is irrelevant and is therefore ignored for the following considerations:

As in Marx generators triggered by conventional methods, the static breakdown voltage of the spark gaps is set to about 5–10% above the charge voltage of the individual stages. The setting is provided in accordance with the Paschen curve generally by a variation of the electrode gap and/or the gas pressure in the spark gap device. After the firing of the three spark gaps FS1 to FS3, the capacitors C1 to C3 are switched in series to the load R1, by way of which they discharge in the main current path. Low current side discharge paths extend via the charging windings L1–L4. The lowermost stage capacitor C 1 is connected to ground potential serving as a reference potential. During the charging procedure, all three stage capacitors C1, C2, C3 are charged via the power supply N1 to the stage voltage of for example 50 kV via the charging winding L1 to L4 with an uncontrolled current with an initial current limit or a constant current of for example 300 mA. For test operations, the output voltage of the power supply is limited to the final charge voltage of 50 kV. As power supply, a commercially available capacitor charging apparatus or a DC power supply may be used. In FIG. 1, a voltage pulse with an amplitude of for example about 6 kV is applied to the charging winding which includes a pulse transformer for triggering at the input winding. In another embodiment for providing energy from an electric power source, a current pulse is applied which drops within for example about 300 nsec from for example 120 A to 0A and which generates at the output winding of the pulse transformer, the charging winding, a voltage pulse which increases up to the breakdown of the spark gap. FIG. 4 shows the course of such a voltage pulse in an exemplary way. The amount of the dynamic break-down voltage of the spark gap is here 12.5 kV. This measurement was taken outside the Marx generator during testing of the trigger circuit. Because of the feedback of the ohmic/damped capacitive measurement divider used, the voltage increase in this test measurement is slower than during operation without connected measurement divider. During laboratory test operations, the spark gaps are simple ball spark gaps; for demanding operation in an industrial plant the calottes of the spark gap may have a wear-resistant profile such as a Borda-profile (see for example DE 102 03 649), particularly to establish a long-time constant operating behavior.

The numbers given in these exemplary embodiments are based on an actual embodiment of a Marx generator triggered in the manner as described. In principle, the novel triggering method may also be used in connection with Marx generators with stage voltages of a few up to several 100 kV and particularly also with a higher stage number.

REFERENCES

[1] McPhee et al.: The Design and Electrostatic Modeling of a High Voltage, Low Jitter Trigatron For Repetitive Operation, IEEE 1995.
[2] Wang et al.: A Compact Repetitive Marx Generator, IEEE, 1999.
[3] Kellogg: A Laser-Triggered Mini-Marx For Low-Jitter High-Voltage Applications, IEEE, 1999
[4] Frost et al.: Ultra-Low Jitter Repetitive Solid State Picosecond Switching, IEEE, 1999
[5] Engel, Kristiansen: A Compact High Voltage Vector Inversion Generator, IEEE.
[6] Turnbull et al.: The Repetitive Operation of a Spark Gap Column, IEEE, 1997.

What is claimed is:

1. A trigger/firing arrangement in a Marx generator comprising n stage capacitors—n being a natural number greater than 1-, the same amount of switches/spark gaps, and 2(n−1) charging branches, with the spark gaps operating in a self-breakdown mode, the trigger-/firing arrangement comprising at least a pulse transformer connected to a pulse generator in at least one of the charging branches of the Marx-generator, which, with the associated stage capacitor, bridges a spark gap—except for the output end spark gap-, a pulse transformer connected, such that the output winding thereof operates during charging as, or also as, a charging winding/inductivity and the input winding thereof being connected to the pulse generator in such a way that the voltage pulse generated with this pulse transformer during ignition/triggering of the pulse generator is added to the charge voltage of the associated stage capacitor and, with a corresponding polarity, generates during the increase of the voltage pulse an over-voltage sufficient for initiating self-breakdown at this spark gap.

2. A trigger/firing arrangement according to claim 1, wherein the charging branches of the Marx generator have each only one charging winding and at least one of the charging windings is expanded to an pulse transformer.

3. A trigger/firing arrangement according to claim 1, wherein the charging branches of the Marx-generator each include a charging resistor and in at least one charging branch an pulse transformer is arranged directly in series with, or parallel to, the charging resistor.

4. A trigger/firing arrangement according to claim 2, wherein two charging branches which are each connected to a spark gap, include each an pulse transformer.

5. A trigger/firing arrangement according to claim 4, wherein the input winding of the two pulse transformers are arranged in series and connected to a common pulse generator.

6. A trigger/firing arrangement according to claim 4, wherein the input winding of the two pulse transformers are arranged in parallel and connected to a common pulse generator.

7. A trigger/firing arrangement according to claim 4, wherein the input windings of the two pulse transformers are each connected to an pulse generator.

8. A trigger/firing arrangement according to claim 5, wherein the pulse generator is connected electrically to a control device.

9. A trigger/firing arrangement according to claim 5, wherein the pulse generator is connected to a control device via a light conductor.

10. A trigger/firing arrangement according to claim 1, wherein the pulse generator and the input windings connected thereto represent an electric power supply and the electric power can be switched off rapidly by the power supply.

11. A trigger/firing arrangement according to claim 1 wherein the pulse generator is a voltage source and the output winding of the pulse transformer is provided with a throttle coil arranged in series.

12. A trigger/firing arrangement according to claim 11, wherein the voltage source is a capacitor with a switch or a, with regard to the Marx generator to be operated, small Marx-generator operating as a switch.

13. A trigger/firing arrangement according to claim 1, wherein the winding sense of the input side winding connected to the pulse transformer is such that the voltage induced in the input winding by the increase of the discharge current of the Marx generator is oriented opposite the voltage induced in the output winding.

* * * * *